US012201037B2

(12) United States Patent
Bedell et al.

(10) Patent No.: US 12,201,037 B2
(45) Date of Patent: Jan. 14, 2025

(54) CLUSTER TOOL FOR PRODUCTION-WORTHY FABRICATION OF DOLAN BRIDGE QUANTUM JOSEPHSON JUNCTION DEVICES

(71) Applicant: INTERNATIONAL BUSINESS MACHINES CORPORATION, Armonk, NY (US)

(72) Inventors: Stephen W. Bedell, Wappingers Falls, NY (US); Steven J. Holmes, Ossining, NY (US); Ning Li, White Plains, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 857 days.

(21) Appl. No.: 16/675,651

(22) Filed: Nov. 6, 2019

(65) Prior Publication Data

US 2021/0135085 A1 May 6, 2021

(51) Int. Cl.
*H01L 39/24* (2006.01)
*C23C 14/04* (2006.01)
(Continued)

(52) U.S. Cl.
CPC ....... *H10N 60/0912* (2023.02); *C23C 14/042* (2013.01); *C23C 14/165* (2013.01); *C23C 14/28* (2013.01); *C23C 14/56* (2013.01)

(58) Field of Classification Search
None
See application file for complete search history.

(56) References Cited

U.S. PATENT DOCUMENTS 6,237,529 B1 5/2001 Spahn
7,253,654 B2 8/2007 Amin
(Continued)

FOREIGN PATENT DOCUMENTS

CN 109440067 A 3/2019
JP S58-107483 A 6/1983
(Continued)

OTHER PUBLICATIONS

International Search Report and Written Opinion received for PCT Application Serial No. PCT/EP2020/081208 dated Feb. 18, 2021, 18 pages.
(Continued)

*Primary Examiner* — Jethro M. Pence
(74) *Attorney, Agent, or Firm* — Amin, Turocy & Watson, LLP

(57) ABSTRACT

A deposition system includes a deposition source and a scanning stage disposed within a deposition path of the deposition source. The scanning stage includes a support platform configured to support a wafer thereon, and a mechanical actuator coupled to the support platform. The mechanical actuator is configured to translate the support platform with respect to the deposition source. The deposition system includes a proximity mask disposed within the deposition path of the deposition source between the deposition source and the scanning stage, the proximity mask defining a slit. The deposition system includes a controller in communication with the scanning stage, the controller configured to control the mechanical actuator to translate the wafer with respect to the slit such that an angle of deposition remains substantially constant. In operation, the proximity mask prevents deposition source material having a trajectory that is out of alignment with the slit from contacting the wafer.

10 Claims, 13 Drawing Sheets

(51) Int. Cl.
*C23C 14/16* (2006.01)
*C23C 14/28* (2006.01)
*C23C 14/56* (2006.01)
*G03F 1/36* (2012.01)
*H10N 60/01* (2023.01)

(56) References Cited

U.S. PATENT DOCUMENTS

| | | | |
|---|---|---|---|
| 8,628,620 B2* | 1/2014 | Kawato | C23C 14/042 |
| | | | 118/504 |
| 8,632,635 B2 | 1/2014 | Lee et al. | |
| 8,691,016 B2* | 4/2014 | Sonoda | C23C 14/12 |
| | | | 438/944 |
| 8,882,918 B2* | 11/2014 | Kawato | C23C 14/562 |
| | | | 118/729 |
| 9,076,989 B2* | 7/2015 | Sonoda | H10K 71/00 |
| 9,177,814 B2 | 11/2015 | Chang et al. | |
| 9,458,532 B2* | 10/2016 | Sonoda | C23C 14/12 |
| 9,493,872 B2* | 11/2016 | Kawato | C23C 14/24 |
| 9,614,155 B2* | 4/2017 | Isomura | H10K 71/166 |
| 9,622,319 B2* | 4/2017 | Sonoda | C23C 14/042 |
| 9,947,904 B2* | 4/2018 | Sonoda | C23C 14/042 |
| 10,760,155 B2* | 9/2020 | Inoue | H10K 50/11 |
| 2005/0079418 A1* | 4/2005 | Kelley | C23C 14/562 |
| | | | 29/623.1 |
| 2005/0211172 A1 | 9/2005 | Freeman et al. | |
| 2005/0281948 A1 | 12/2005 | Grace et al. | |
| 2008/0187683 A1* | 8/2008 | Haglund | C23C 14/042 |
| | | | 427/596 |
| 2011/0242447 A1 | 10/2011 | Terao | |
| 2013/0299345 A1 | 11/2013 | Abarra et al. | |
| 2015/0030759 A1* | 1/2015 | Zhang | C23C 14/0021 |
| | | | 427/596 |
| 2015/0114297 A1* | 4/2015 | Kawato | C23C 14/12 |
| | | | 118/726 |
| 2015/0321214 A1* | 11/2015 | Cox | H01L 21/67333 |
| | | | 118/500 |
| 2018/0358537 A1 | 12/2018 | Brink et al. | |
| 2019/0071762 A1* | 3/2019 | Kobayashi | C23C 14/042 |
| 2019/0148641 A1* | 5/2019 | Kim | B23K 26/0624 |
| | | | 219/121.69 |
| 2019/0276926 A1 | 9/2019 | Lee et al. | |
| 2021/0135085 A1* | 5/2021 | Bedell | C23C 14/16 |
| 2023/0017083 A1* | 1/2023 | Chen | C21D 6/001 |

FOREIGN PATENT DOCUMENTS

| | | |
|---|---|---|
| JP | H08-045032 A | 2/1996 |
| JP | 2007-294190 A | 11/2007 |
| JP | 2012-233214 A | 11/2012 |
| JP | 2013-253316 A | 12/2013 |
| JP | 2019-137895 A | 8/2019 |
| JP | 2019-189908 A | 10/2019 |
| WO | 96/24155 A1 | 8/1996 |
| WO | 2011/058812 A1 | 5/2011 |
| WO | 2017/217959 A1 | 12/2017 |

OTHER PUBLICATIONS

Schuffelgen et al., "Selective Area Growth and Stencil Litography for in Situ Fabricated Quantum Devices", Nature Nanotechnology, Nature Publishing Group, vol. 14, No. 9, Jul. 29, 2019, pp. 825-831.
Van Den Hamer et al., "Self-aligning Resist Techniques for Shadow Evaporation of a Superconducting Three-terminal Device", Microelectronic Engineering, Elsevier Publishers BV., Amsterdam, NL, vol. 3, No. 1-4, Dec. 1, 1985, pp. 427-433.
Schnitzel et al., "Scanning Evaporator Apparatus for Semiconductor Water/Substrate and Module Deposition", ip.com, ip.com Inc., West Henrietta, NY, US, Jul. 1, 1988.
Angstrom Engineering, "Josephson Junction | Thin Film Deposition for Superconducting Circuits", Accessed: Aug. 1, 2019. URL: https://angstromengineering.com/josephson-junction-thin-film-deposition-superconducting-circuits/.
Chang et al., "Improved superconducting qubit coherence using titanium nitride", Applied Physics Letters, vol. 103, No. 1, 2013, pp. 012602-1-012602-3.
Dolan, "Offset masks for lift-off photoprocessing", Applied Physics Letters, vol. 31, No. 5, Sep. 1, 1977, pp. 337-339 (4 pages total).
Dolan et al., "Very Small (<20 mm) Lithographic Wires, Dots, Rings, and Tunnel Junctions", Physica B: Condensed Matter, vol. 152, 1988, pp. 7-13.
Perekrestov et al., "Ti/TiO2 Thin Films Deposition by Means of Hollow Cathode Plasma Jet", WDS'12 Proceedings of Contributed Papers, Part II, 38-43, 2012.
Response to the communication pursuant to R 161(1) and R 162 EPC received for European Patent Application Serial No. 20803523.8 dated Sep. 15, 2022, 5 pages.
Notice of Reasons for Refusal received for Japanese Patent Application Serial No. 2022-523065 dated May 28, 2024, 8 pages(Including English Translation).
Japanese Patent Office, "Decision to Grant a Patent", Nov. 5, 2024, 5 pages, Application No. JP2022-523065.

* cited by examiner

CLUSTER TOOL FOR PRODUCTION-WORTHY FABRICATION OF DOLAN BRIDGE QUANTUM JOSEPHSON JUNCTION DEVICES

BACKGROUND

The present invention relates to a tool for fabrication of quantum devices, and more specifically, to a cluster tool for production-worthy fabrication of Dolan bridge Josephson junction device.

The fabrication of Dolan bridge Josephson junction qubits is currently being developed on non-manufacturing equipment that can handle small pieces of wafers, but not whole wafers. The uniformity of the processing is insufficient to enable image formation with tolerances consistent with manufacturing of quantum chips. Current fabrication techniques can result in image size variation due to inconsistent angle of evaporation, and junction dielectric variation due to insufficient process controls. Junction dielectric variation may alter the frequency of the quantum device, such as a qubit, and may also introduce defects into the junction dielectric that could couple to the quantum device, shortening the device's coherence time. Thus, systems and methods are needed for fabricating quantum devices on a full wafer scale.

SUMMARY

According to an embodiment of the present invention, a deposition system includes a deposition source and a scanning stage disposed within a deposition path of the deposition source. The scanning stage includes a support platform configured to support a wafer thereon, and a mechanical actuator coupled to the support platform. The mechanical actuator is configured to translate the support platform with respect to the deposition source. The deposition system includes a proximity mask disposed within the deposition path of the deposition source between the deposition source and the scanning stage, the proximity mask defining a slit. The deposition system includes a controller in communication with the scanning stage, the controller configured to control the mechanical actuator to translate the wafer with respect to the slit such that an angle of deposition remains substantially constant. In operation, the proximity mask prevents deposition source material having a trajectory that is out of alignment with the slit from contacting the wafer. The deposition system provides chemical deposition uniformity capable of full wafer production, enabling a series of uniform features to be formed across the surface of a wafer. The wafer can later be divided into individual chips.

According to an embodiment of the present invention, a cluster tool includes a plurality of selectable fabrication tools. The plurality of selectable fabrication tools include a deposition system including a deposition source and a scanning stage disposed within a deposition path of the deposition source. The scanning stage includes a support platform configured to support a wafer thereon, and a mechanical actuator coupled to the support platform. The mechanical actuator is configured to translate the support platform with respect to the deposition source. The deposition system includes a proximity mask disposed within the deposition path of the deposition source between the deposition source and the scanning stage, the proximity mask defining a slit. The deposition system includes a controller in communication with the scanning stage, the controller configured to control the mechanical actuator to translate the wafer with respect to the slit such that an angle of deposition remains substantially constant. In operation, the proximity mask prevents deposition source material having a trajectory that is not aligned with the slit from contacting the wafer. The plurality of selectable fabrication tools also includes a dielectric system comprising a dielectric source configured to form a dielectric layer on the wafer. In addition to providing the chemical deposition control afforded by the deposition system, the cluster tool enables full processing of structures on a wafer without breaking vacuum.

According to an embodiment of the present invention, a method for performing angled deposition includes providing a deposition source, and disposing a proximity mask in a deposition path of the deposition source, the proximity mask having a slit at a first position with respect to the deposition source. The method further includes translating a wafer with respect to the slit during deposition of deposition source material such that an angle of deposition remains substantially constant, and such that the proximity mask prevents deposition source material having a trajectory that is out of alignment with the slit from contacting the wafer. The method enables angled evaporation with high uniformity over a larger surface area, such as the surface of a wafer. The method enables image formation with tolerances consistent with manufacture of quantum chips.

DETAILED DESCRIPTION

Figure 1:
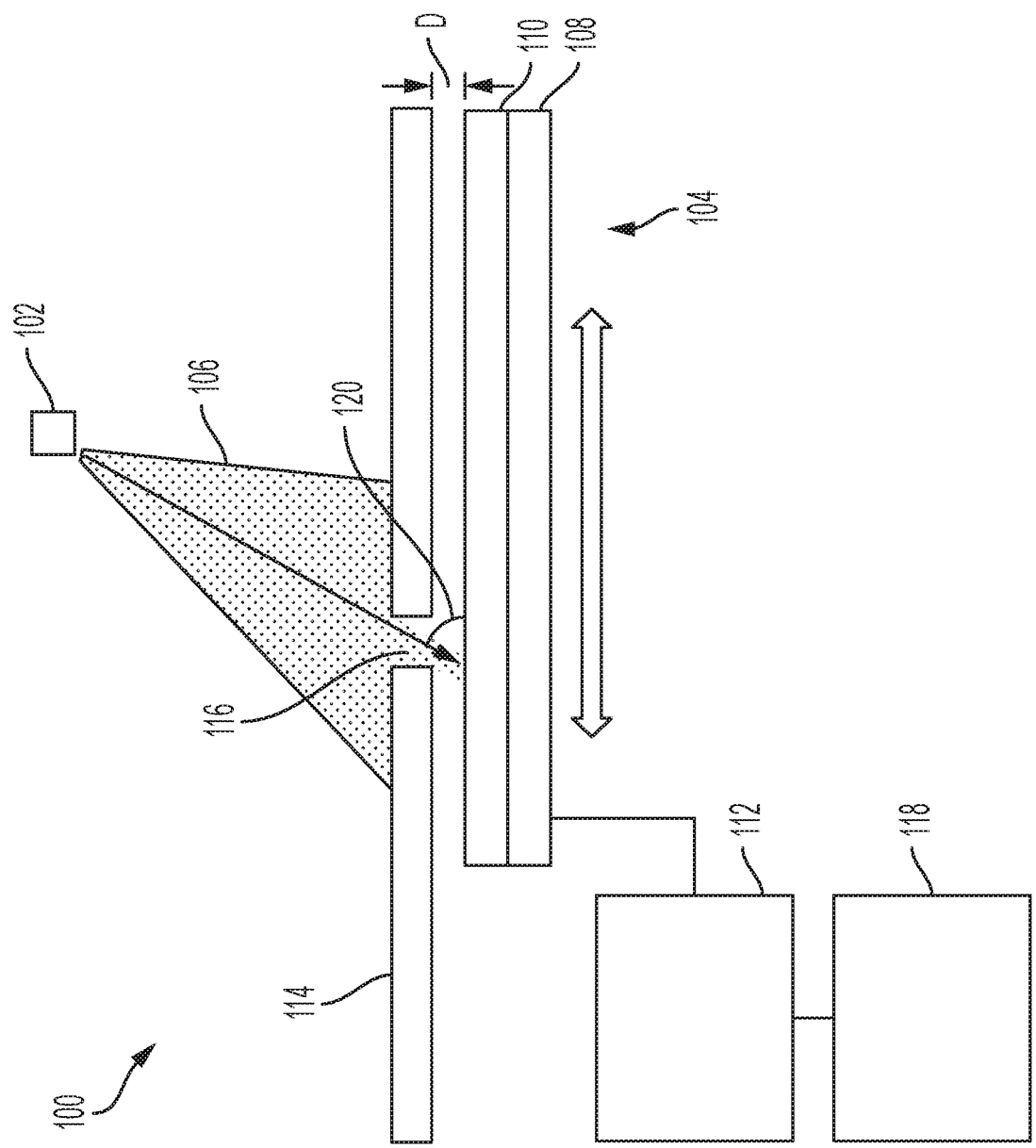
FIG. 1 is a schematic illustration of a deposition system according to an embodiment of the present invention.

FIG. 1 is a schematic illustration of a deposition system 100 according to an embodiment of the present invention. The deposition system 100 includes a deposition source 102, and a scanning stage 104 disposed within a deposition path 106 of the deposition source 102. The scanning stage 104 includes a support platform 108 configured to support a wafer 110 thereon. The scanning stage 104 also includes a mechanical actuator 112 coupled to the support platform 108. The mechanical actuator 112 is configured to translate the support platform 108 with respect to the deposition source 102. The deposition system 100 includes a proximity mask 114 disposed within the deposition path 106 of the deposition source 102 between the deposition source 102 and the scanning stage 104. The proximity mask 114 defines a slit 116. The deposition system 100 includes a controller 118 in communication with the scanning stage 104. The controller 118 is configured to control the mechanical actuator 112 to translate the wafer 110 with respect to the slit 116 such that an angle of deposition 120 remains substantially constant. In operation, the proximity mask 114 prevents deposition source material having a trajectory that is out of alignment with the slit 116 from contacting the wafer 110.

The term "substantially constant" is intended to mean that the angle of deposition may vary by ±10° or less. According to some embodiments, the angle of deposition may vary by ±5° or less.

Figure 2:
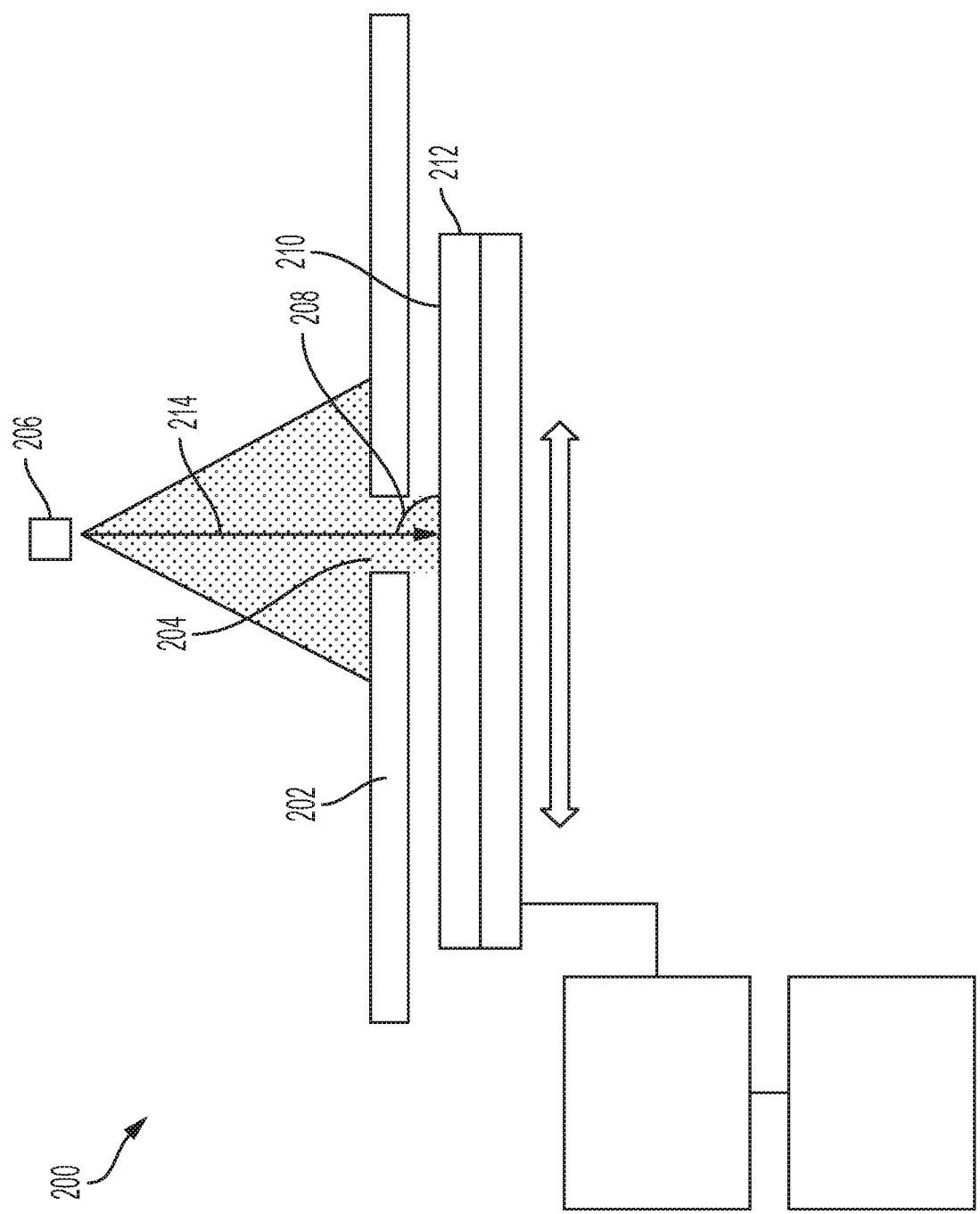
FIG. 2 is a schematic illustration of a deposition system according to an embodiment of the present invention having a different angle of deposition than the deposition system of FIG. 1.

FIG. 2 is a schematic illustration of a deposition system 200 according to an embodiment of the present invention. In FIG. 2, the proximity mask 202 is configured such that the slit 204 is positioned directly below the deposition source 206. In this embodiment, the angle of deposition 208 is 90°. According to some embodiments of the present invention, the angle of deposition is defined as the angle between the deposition surface 210 of the wafer 212, and a line 214 connecting the deposition source 206 to the wafer 212 and passing through the center of the slit 204.

Figure 3:
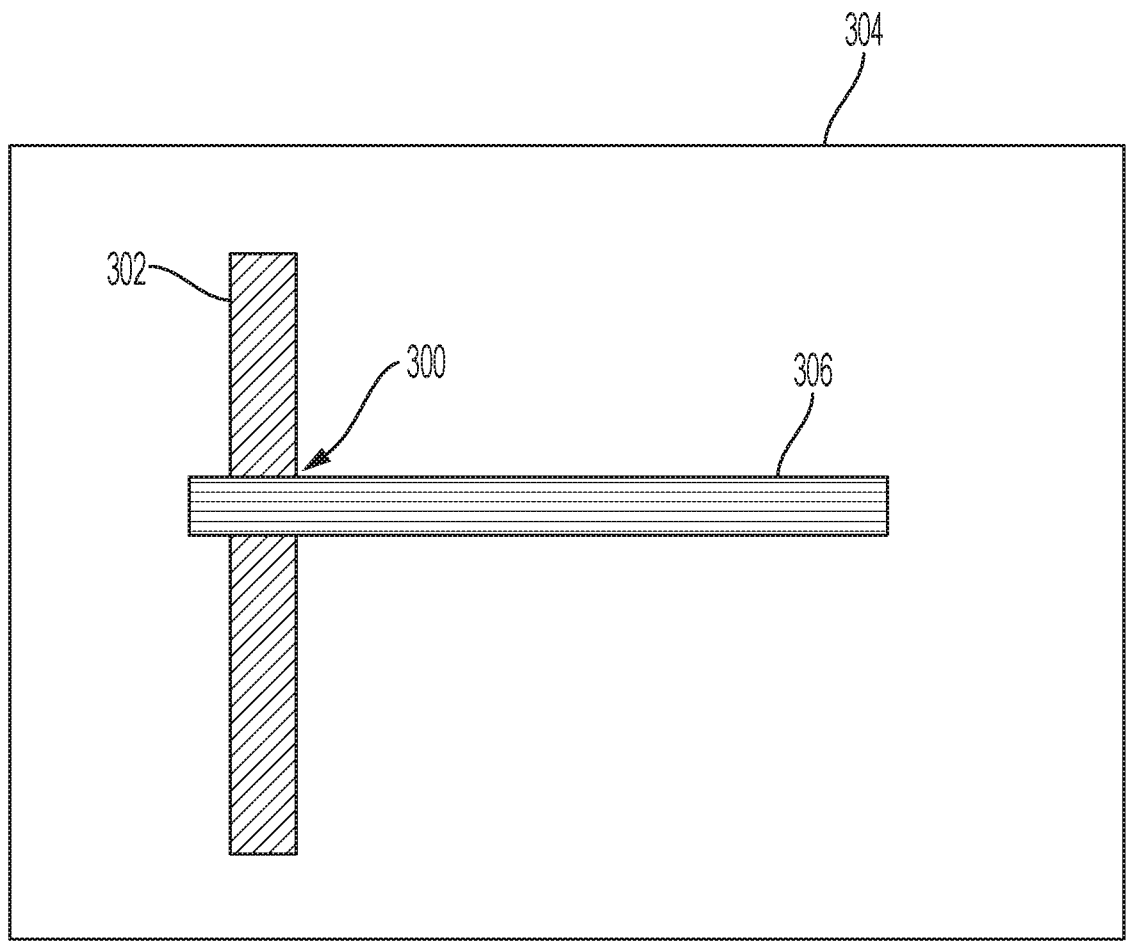
FIG. 3 is a schematic illustration of a Dolan bridge Josephson junction.

The deposition system schematically illustrated in FIG. 1 and FIG. 2 can be used to form uniform structures on a wafer. For example, the system could be used to form Dolan bridge Josephson junctions. FIG. 3 is a schematic illustration of a Dolan bridge Josephson junction 300. The Dolan bridge Josephson junction 300 includes a first lead 302 formed on a substrate 304. The Dolan bridge Josephson junction 300 includes a second lead 306 formed on the first lead 302, with a dielectric layer formed between the first lead 302 and the second lead 306.

Figure 4A:
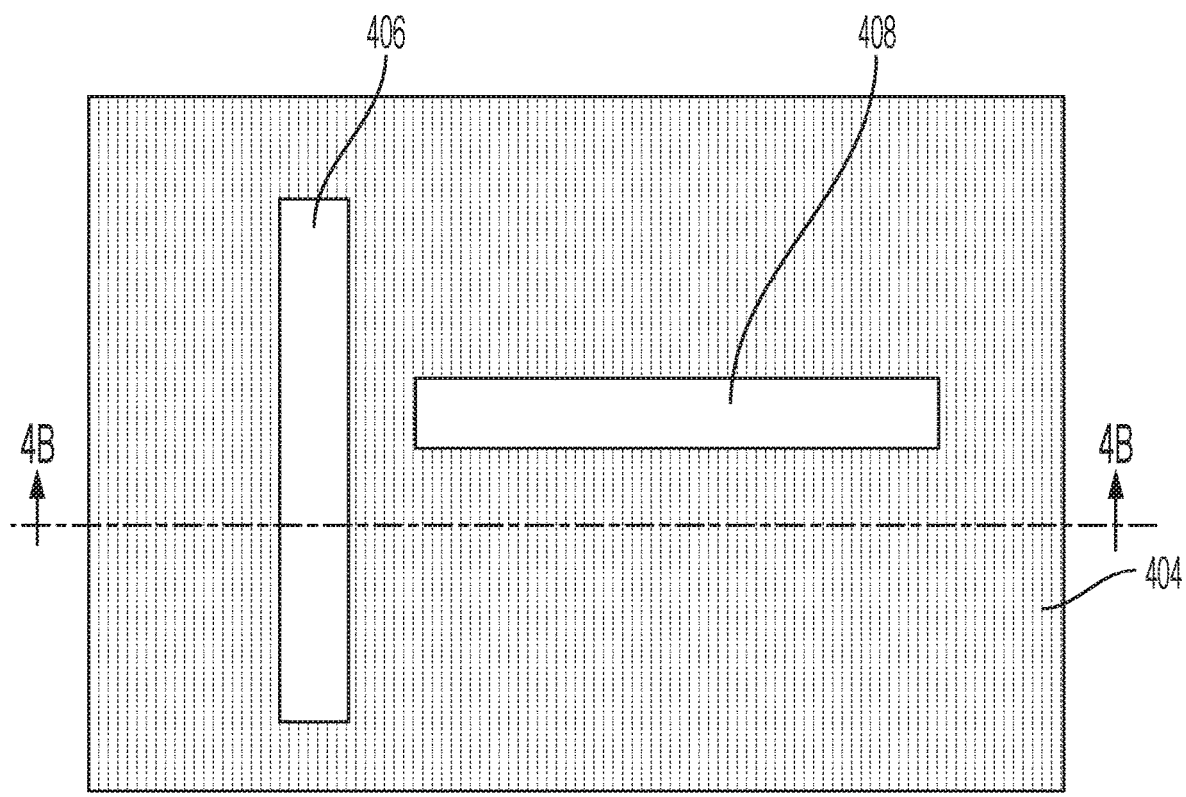
FIG. 4A is a schematic illustration of a plan view of a substrate with a liftoff mask having a first layer and a second layer formed thereon.
Figure 4B:
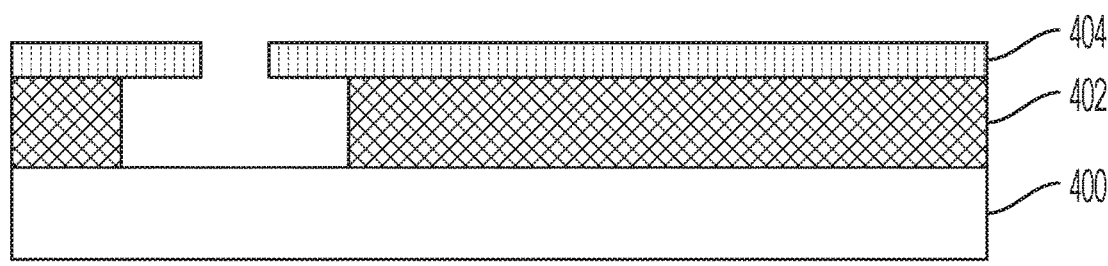
FIG. 4B is a schematic illustration of a cross-sectional view of a substrate with a liftoff mask having a first layer and a second layer formed thereon.

FIGS. 4A-7B schematically illustrate an example process for forming a Dolan bridge Josephson junction. FIGS. 4A and 4B are schematic illustrations of a plan view and a cross-sectional view of a substrate 400 with a liftoff mask having a first layer 402 and a second layer 404 formed thereon. The first layer 402 and the second layer 404 are patterned, for example, using lithographic patterning, to exposed portions 406, 408 of the substrate 400 on which the Dolan bridge Josephson junction will be formed. The first layer 402 and second layer 404 may be chosen such that etching exposes a portion of the substrate 400 that is larger than the area of the opening in the second layer 404. The first layer 402 may include, for example, an organic polymer, or a material that is soluble in an organic solvent. The second layer 404 may include, for example, titanium or silicon. The first layer 402 and second layer 404 may be etched, for example, using reactive ion etching. The etching may etch the first layer 402 more quickly than the second layer 404.

Figure 5A:
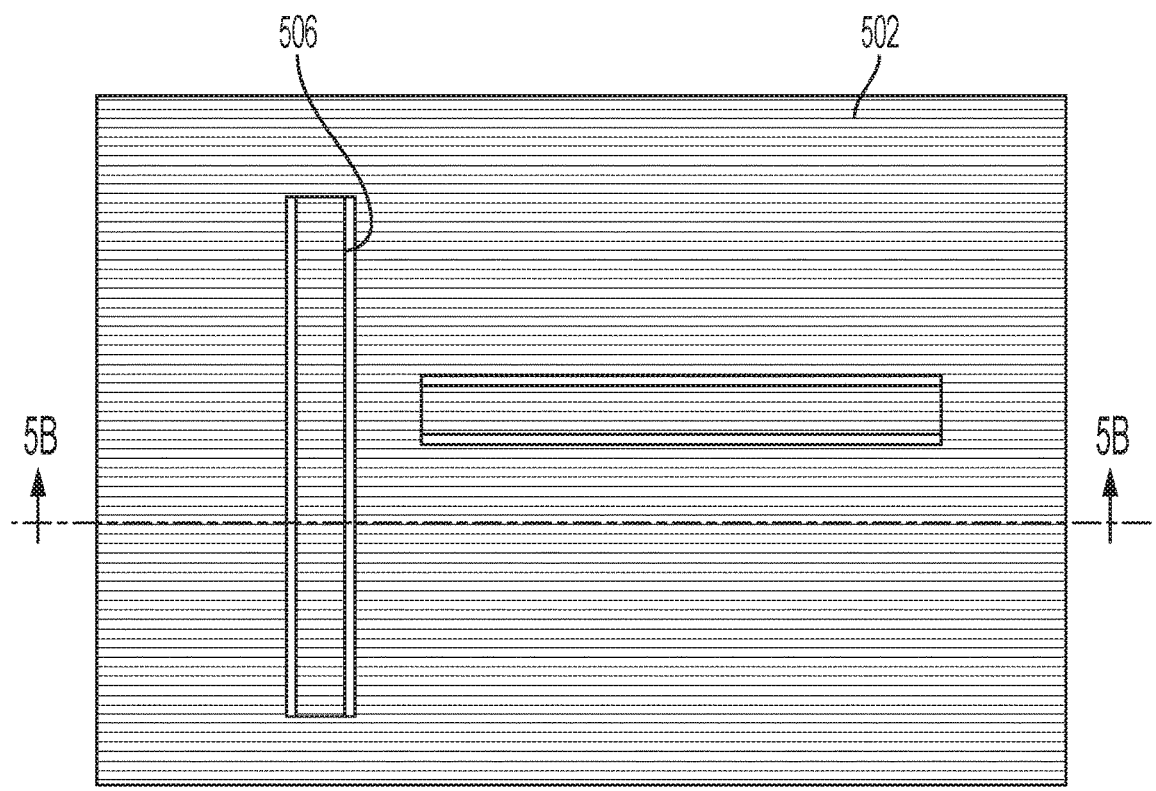
FIG. 5A is a schematic illustration of a plan view of the substrate with a metal layer deposited on the second layer of the liftoff mask, and on the exposed substrate.
Figure 5B:
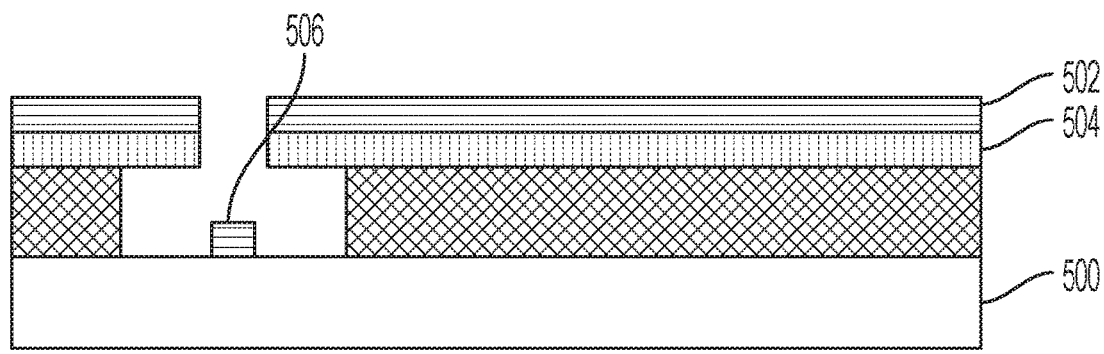
FIG. 5B is a schematic illustration of a cross-sectional view of the substrate with a metal layer deposited on the second layer of the liftoff mask, and on the exposed substrate.

The process may include depositing a metal on the mask and the exposed substrate. In one example, the metal is deposited using 90° deposition. FIGS. 5A and 5B are schematic illustrations of a plan view and a cross-sectional view of the substrate 500 with a metal layer 502 deposited on the second layer 504 of the liftoff mask, and on the exposed substrate 500. The portion 506 of the metal layer 502 deposited on the substrate 500 forms the first lead of the Dolan bridge Josephson junction. The metal layer 502 may include, for example, aluminum, lead, titanium, tantalum, tantalum nitride, titanium nitride, vanadium, or niobium.

Figure 6A:
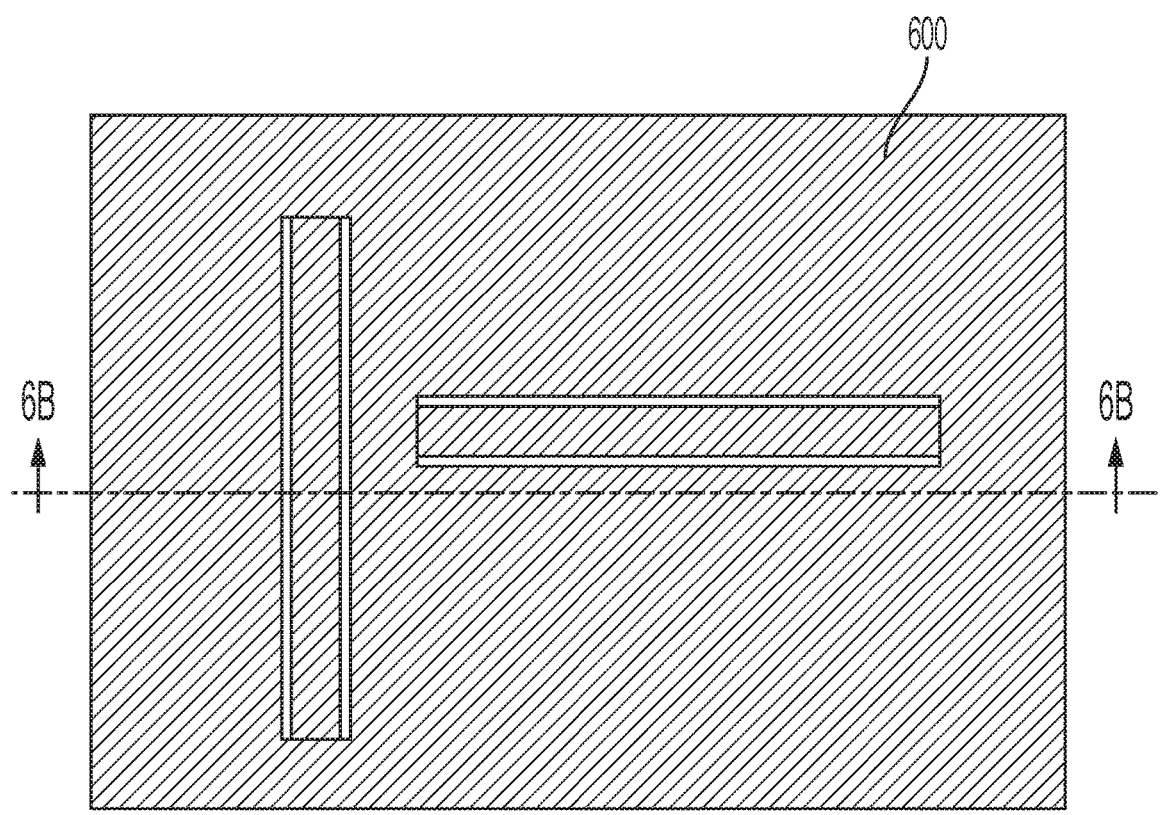
FIG. 6A is a schematic illustration of a plan view of a dielectric layer formed on the portion of the metal layer deposited on the substrate.
Figure 6B:
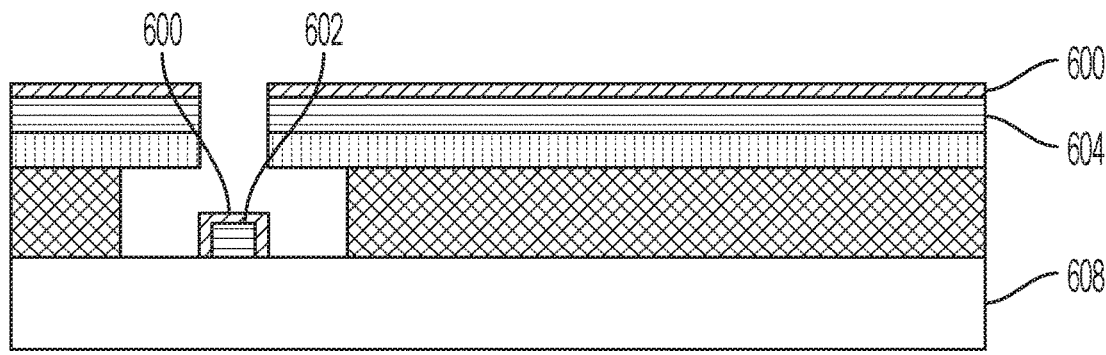
FIG. 6B is a schematic illustration of a cross-sectional view of a dielectric layer formed on the portion of the metal layer deposited on the substrate.

The process may include forming a dielectric layer on the portion of the metal layer deposited on the substrate. This may include depositing a dielectric material on the metal layer, or exposing the metal layer to oxygen to form a dielectric layer. FIGS. 6A and 6B are schematic illustrations of a plan view and a cross-sectional view of a dielectric layer 600 formed on the portion 602 of the metal layer 604 deposited on the substrate 608.

Figure 7A:
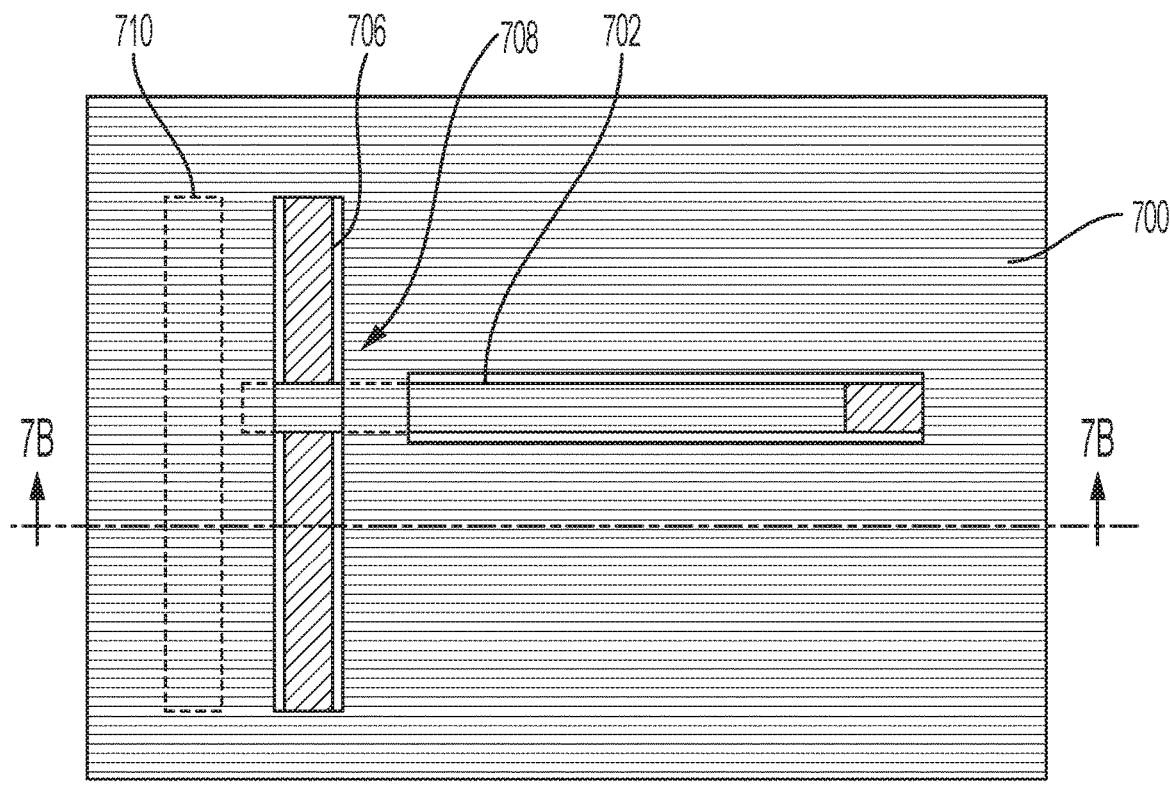
FIG. 7A is a schematic illustration of a plan view of a second metal layer formed by directional deposition.
Figure 7B:
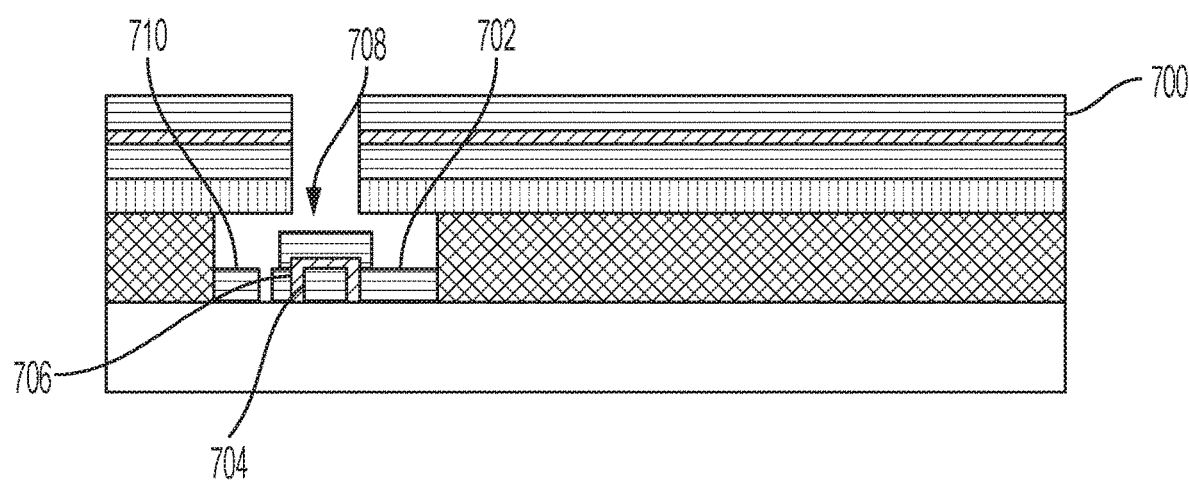
FIG. 7B is a schematic illustration of a cross-sectional view of a second metal layer formed by directional deposition.

The process may include forming a second metal layer using directional deposition, with an angle of deposition that is different than the angle of deposition used to form the first lead of the Dolan bridge Josephson junction. For example, the deposition source may be positioned to have an angle of deposition between 45° and 60°. FIGS. 7A and 7B are schematic illustrations of a plan view and a cross-sectional view of a second metal layer 700 formed by directional deposition. A portion 702 of the second metal layer 700 may form the second lead of the Dolan bridge Josephson junction. The overlapping first lead 704, dielectric layer 706, and second lead 702 form a Josephson junction 708. Due to the directional nature of the metal deposition, an additional metal feature 710 may be deposited on the substrate through the opening used to form the first lead 704 by 90° deposition. Further, portions of the dielectric layer 706 formed on the first lead 704 remain exposed, as schematically illustrated in FIG. 7A. The second metal layer 700 may include, for example, aluminum, lead, titanium, tantalum, tantalum nitride, titanium nitride, vanadium, or niobium.

Figure 8:
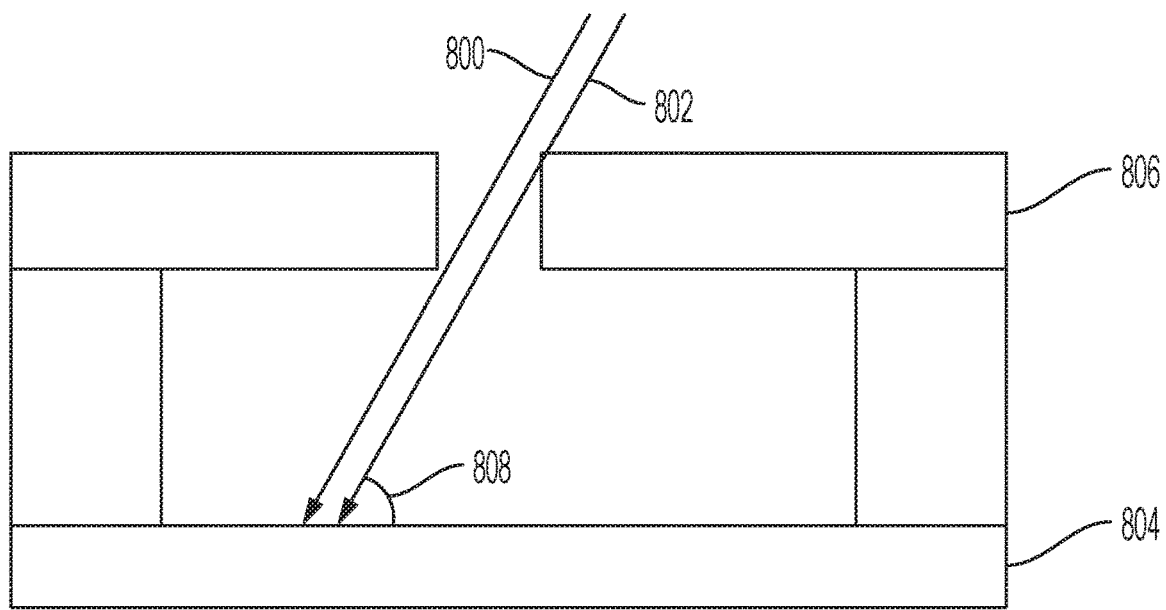
FIG. 8 is a schematic illustration of directional deposition.

FIG. 8 is a schematic illustration of directional deposition. In FIG. 8, the two lines 800, 802 signifying the trajectory of deposition material are parallel, enabling controlled formation of features on the substrate 804. The mask 806 prevents the angle of deposition 808 from deviating substantially. While this setup may be sufficient for depositing a feature on a single chip, it is insufficient for patterning features across a full wafer. Classical computer chips are formed on semiconductor wafers, which are then divided into chips. As quantum computing advances, there is a constant push to increase the number qubits in a quantum processor. Machining techniques that enable reliable formation of qubit chips in bulk quantities are needed. However, the directional deposition technique shown in FIG. 8 relies on the ability to control the angle of deposition 808. When a single deposition source is used to dispose metal over a large area, the angle of deposition can change, as illustrated in FIG. 9.

Figure 9:
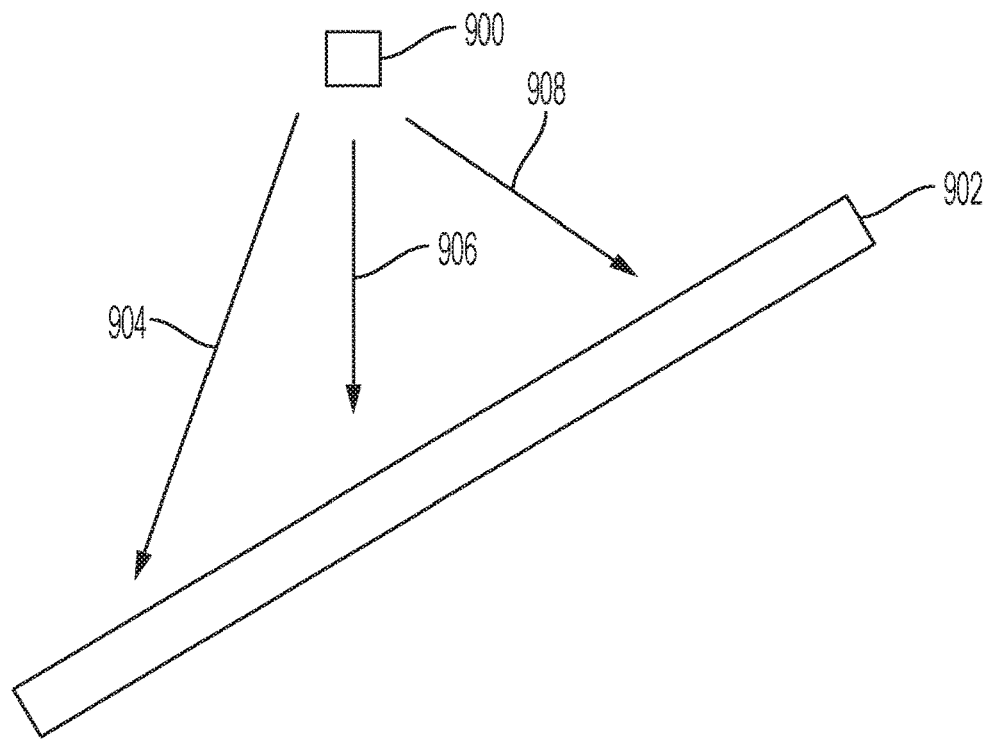
FIG. 9 is a schematic illustration of a deposition source disposing a material on a wafer.
Figure 10:
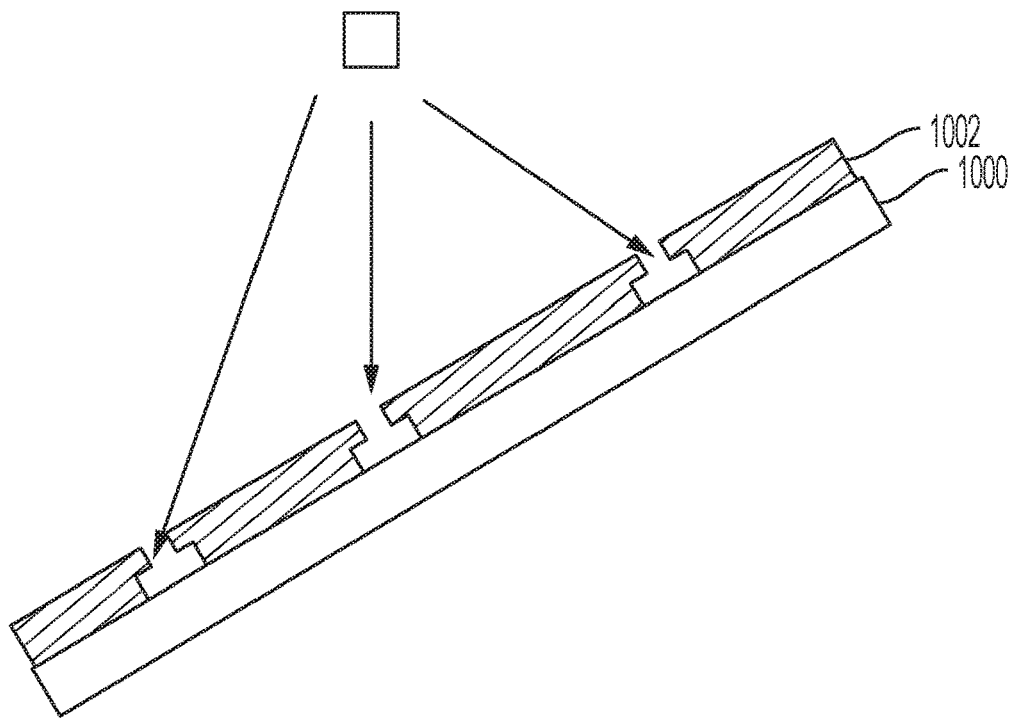
FIG. 10 is a schematic illustration of a wafer with a mask formed thereon.

FIG. 9 is a schematic illustration of a deposition point source 900 disposing a material on a wafer 902. As represented by the three arrows 904, 906, 908, the angle of deposition varies significantly over the surface of the wafer 902, which results in variation in feature size on the wafer 902, as well as variation in the relative positions of features. FIG. 10 is a schematic illustration of a wafer 1000 with a mask 1002 formed thereon, such as the mask 402, 404 in FIG. 4 used to create a Dolan bridge Josephson junction. FIG. 10 illustrates how the angle of deposition is different for each of the three openings in the mask 1002. The variation in the angle results in variation in the size and relative position of the features formed on the wafer 1000. Accordingly, when the wafer 1000 is divided into chips, the features on the chips will vary from chip to chip.

The deposition system schematically illustrated in FIG. 1 addresses the issue of variation in the angle of deposition. The system 100 includes a proximity mask 114 between the deposition source 102 and the wafer 110, and enables scanning of wafer 110 across the slit 116 in the proximity mask 114. The system 100 ensures that angle of deposition 120 and the distance from the deposition source 102 to the wafer 110 remains substantially constant across the whole wafer 110. Thus, after deposition, the wafer 110 can be partitioned into substantially identical chips. The system 100 does not require a collimated evaporation source, simplifying the system design.

The distance from the deposition source 102 to the proximity mask 114 may be relatively short, reducing material loss and tool footprint. The slit 116 may have a width or (of) about 2 cm or less, for example. Reducing the size of the slit 116 enhances angle control, but penalizes throughput. Conversely, increasing the size of the slit 116 allows deposition at a faster rate, but also results in degradation of angle control. The distance D between the proximity mask 114 and the wafer 110 may be about 2 cm or less. If the distance D is too large, the material will spread out after passing through the slit 116. According to some embodiments, the distance D between the proximity mask 114 and the 110 wafer may be about 1 cm.

Figure 11:
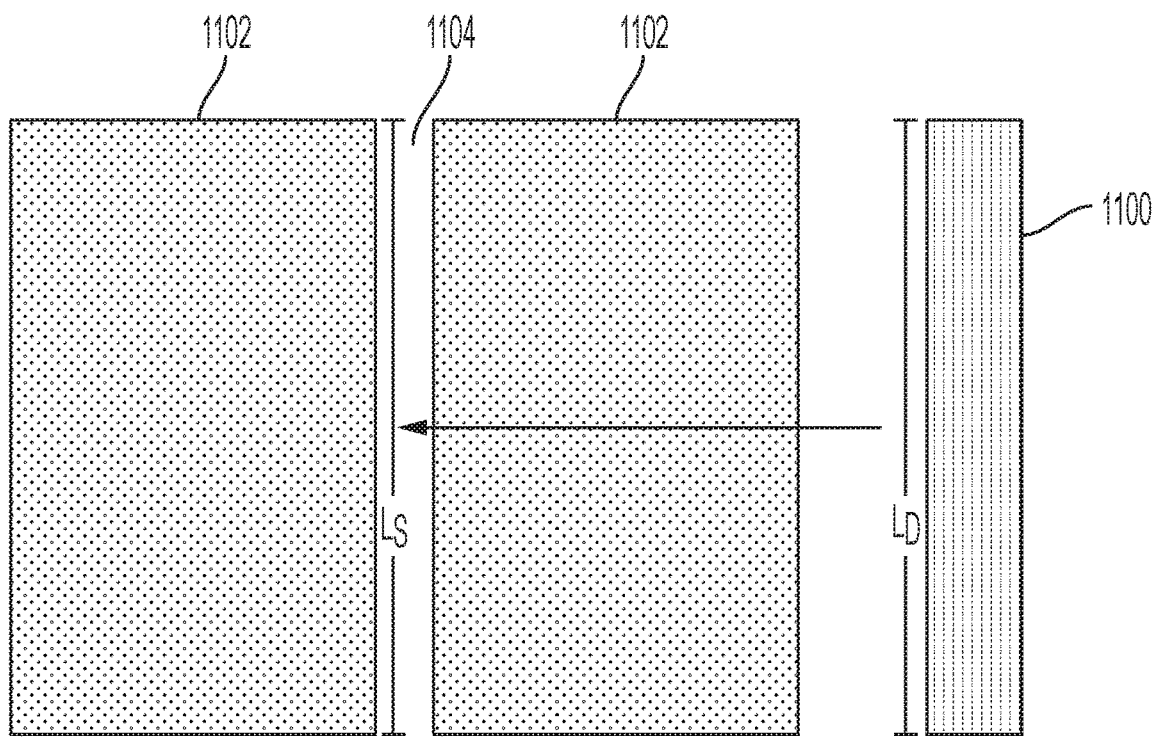
FIG. 11 is a schematic illustration of a plan view of a deposition source and a proximity mask according to some embodiments of the present invention.

FIG. 11 is a schematic illustration of a plan view of a deposition source 1100 and a proximity mask 1102 according to some embodiments of the present invention. The deposition source 1100 spans a length of the slit 1104 in the proximity mask 1102. The deposition source 1100 may be a continuous deposition source disposed in a boat or tray, or may be a series of point sources. Alternatively, the deposition source 1100 may be an ultra high vacuum (UHV) spray/sputter source that has a degree of directionality. In FIG. 11, the deposition source 1100 has a length LD that is equal to the length LS of the slit 1104 in the proximity mask 1102. In some embodiments, the deposition source 1100 may be shorter or longer than the slit 1104. However, configuring the deposition source 1100 to span the slit 1104 may ensure even deposition of the source material on the wafer.

The proximity mask 1102 may include a material that can withstand high heat without warping. The proximity mask 1102 may include, for example, a metal, a ceramic, or a thermally stable carbon. The deposition system may include a cooling system configured to cool the sides of the deposition chamber and/or the proximity mask 1102 to help deposition material adhere to the deposition chamber and proximity mask 1102, instead of flaking or forming blobs that dislodge and create defects on the wafer. The proximity mask 1102 may include a heat sink to aid in cooling the proximity mask 1102 to promote adhesion of deposition material having a trajectory that is not aligned with the slit 1104. According to some embodiments of the invention, the system may include a collimated element between the deposition source 1100 and the proximity mask 1102. For example, a metal bracket or honeycomb structure may be placed near the deposition source 1100 to capture deposition material having a trajectory that deviates from the desired angle of deposition.

Figure 12:
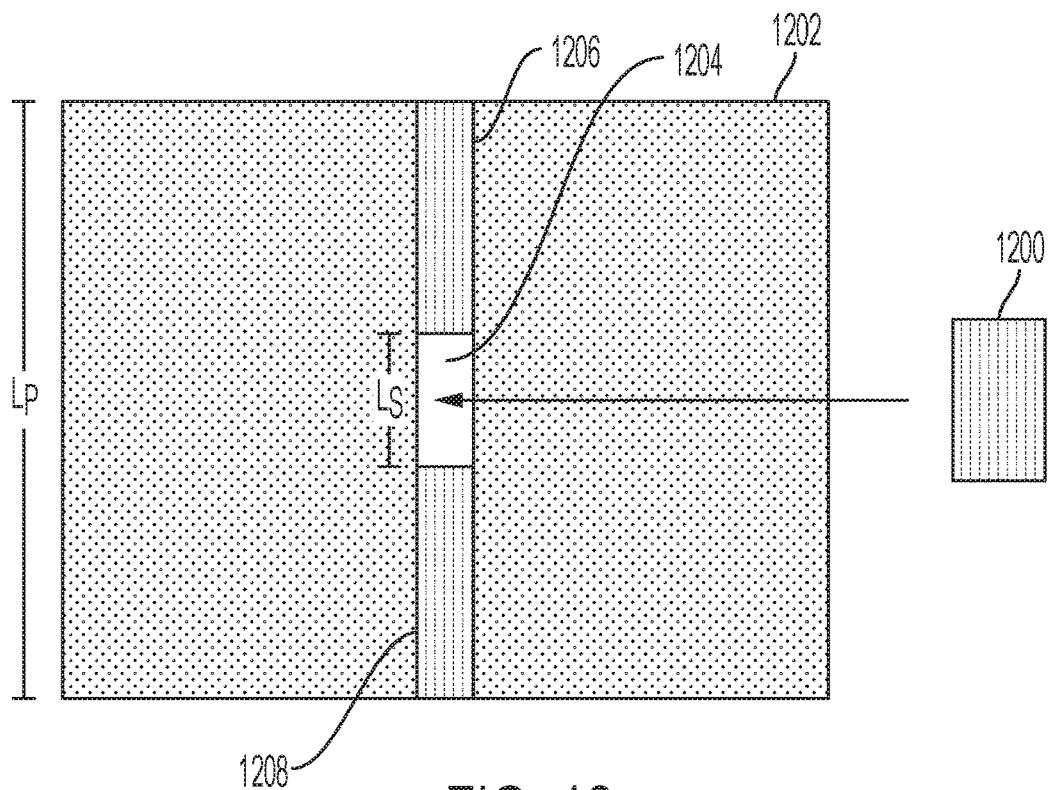
FIG. 12 is a schematic illustration of a plan view of a deposition source and a proximity mask according to some embodiments of the present invention.

FIG. 12 is a schematic illustration of a plan view of a deposition source 1200 and a proximity mask 1202 according to some embodiments of the present invention. The deposition source 1200 spans the length $L_S$ of the slit 1204 in the proximity mask 1202. However, the slit 1204 does not span the length $L_P$ of the proximity mask 1202. Instead, the slit 1204 only exposes part of the wafer in the vertical direction, enabling better angle control along the slit 1204. The configuration shown in FIG. 12 can be used to deposit rows of chips across the wafer in a single scan. For example, the wafer can be aligned to the slit 1204 so that a first set of rows of chips are deposited across the wafer in a single scan, and then either the slit 1204 or the wafer can be stepped to another set of rows, and the wafer can be scan across the slit 1204 again for deposition on the second set of rows of chips. The proximity mask 1202 may include portions 1206, 1208 that are adjustable, enabling adjustment of the length $L_S$ and the position of the slit 1204.

Figure 13:
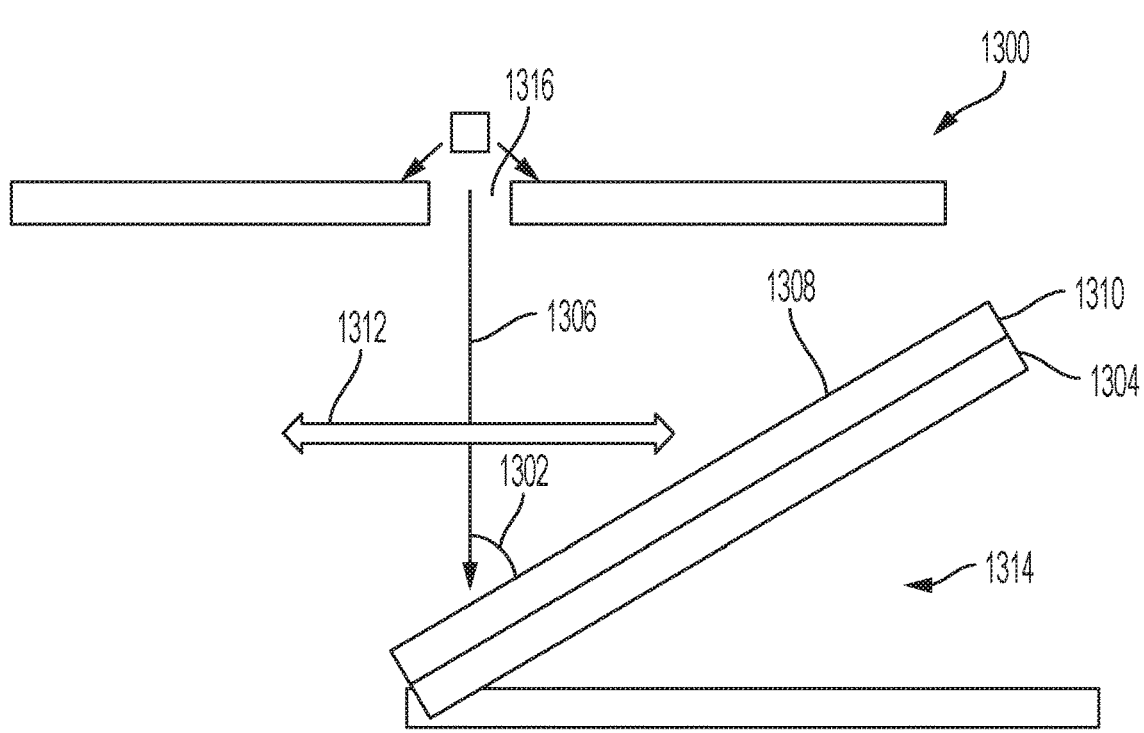
FIG. 13 is a schematic illustration of a deposition system wherein an angle of the support platform with respect to the deposition path is selectable.

FIG. 13 is a schematic illustration of a deposition system 1300 wherein an angle 1302 of the support platform 1304 with respect to the deposition path 1306 is selectable. In this embodiment, the mechanical actuator may be configured to translate the support platform 1304 in a direction 1312 at an oblique angle with respect to a deposition surface 1308 of the wafer 1310. The scanning stage 1314 may include an adjustment mechanism enabling the angle 1302 to be adjusted. The support platform 1304 could have a first configuration for deposition of a first lead of a Dolan bridge Josephson junction, and then the angle 1302 could be adjusted to a second configuration for deposition of a second lead of the Dolan bridge Josephson junction. The deposition system 1300 may include an electron gun prior to the slit 1316 to provide collimation of atoms in the beam. The ionized beam may enhance collimation, and a second proximity mask with a slit may be added in close proximity to the deposition surface 1308 of the wafer 1310 to further improve collimation. Alternatively, an ion implant source could be used. To provide the collimation, high current, for example, plasma immersion implant with an electron grid above the substrate may be used to neutralize the beam prior to deposition. The slit 1316 may be a collimated slit. The configuration schematically illustrated in FIG. 13 may utilize additional chemical deposition control techniques, because the gap from the wafer 1310 to the slit 1316 varies significantly.

Figure 14:
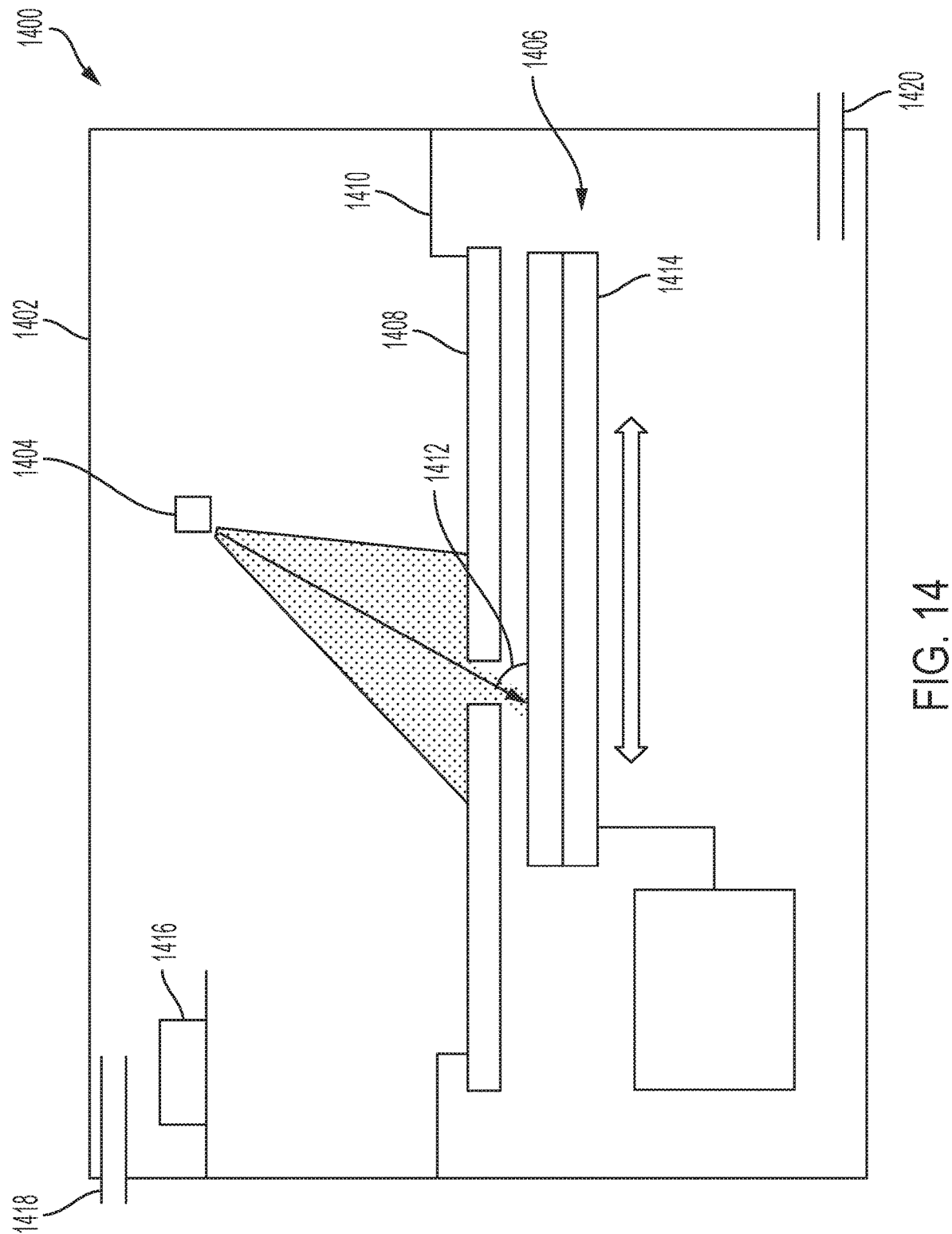
FIG. 14 is a schematic illustration of a deposition system that includes a deposition chamber.

The deposition system may include a deposition chamber. FIG. 14 is a schematic illustration of a deposition system 1400 that includes a deposition chamber 1402. The deposition source 1404, the scanning stage 1406, and the proximity mask 1408 are disposed in the deposition chamber 1402. The deposition system 1400 includes a proximity mask fixture 1410 configured to releasably fix a position of the proximity mask 1408 with respect to the deposition source 1404 to enable selection of the angle of deposition 1412.

According to some embodiments of the invention, the deposition source 1404 is a metal evaporation source. According to some embodiments, the deposition source 1404 is a sputter deposition source. The sputter deposition source may enable control of film thickness, precise dielectric deposition, and precise atomic composition for multi-element materials. According to some embodiments, the deposition source 1404 is a hollow cathode plasma jet (HCPJ) sputtering deposition source. The deposition chamber 1402 and the support platform 1414 may be grounded. According to some embodiments, the deposition system 1400 includes a laser 1416 configured to irradiate the deposition source 1404, and the deposition system 1400 is configured to deposit a deposition source material by pulsed laser deposition. According to some embodiments, the deposition chamber 1402 includes a gas inlet 1418 and a gas outlet 1420 configured to introduce gas into and remove gas from the deposition chamber 1402, and the deposition system 1400 is configured to deposit a source material by sputter deposition. Although the deposition chamber 1402 in FIG. 14 is schematically illustrated as having each of the aforementioned features, the deposition chamber 1402 may have all or a subset of the features, depending on the deposition method being used. According to some embodiments, the deposition system 1400 includes an electron gun for material ionization and beam control, between the deposition source 1404 and the proximity mask 1408. The deposition system 1400 may also include electrode plates to guide the deposition material, potentially resulting in faster film formation and better angle control. The embodiments of the present invention are not limited to the deposition methods described herein. The deposition methods described herein are provided as non-limiting examples.

Figure 15:
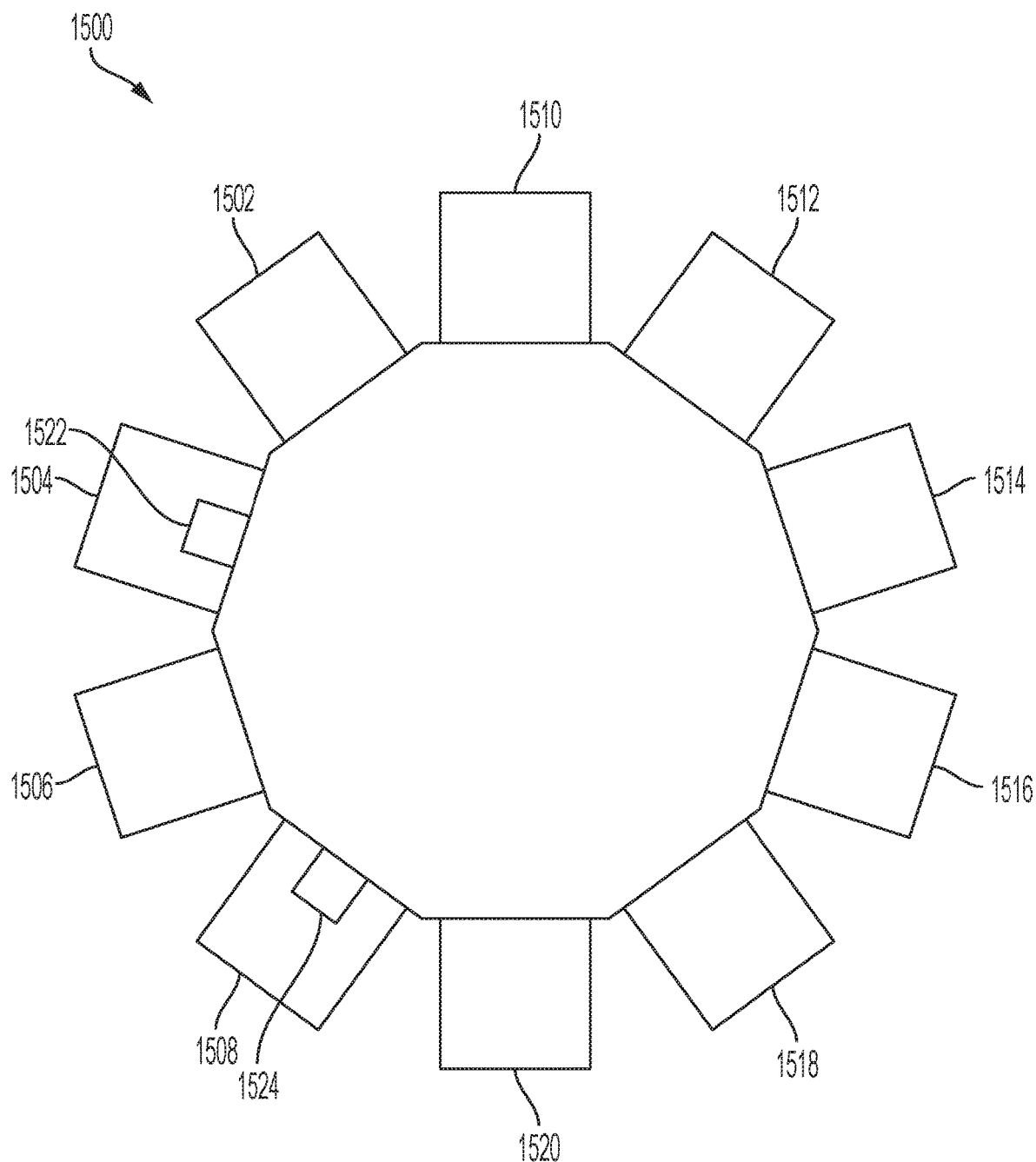
FIG. 15 is a schematic illustration of a cluster tool according to some embodiments of the present invention.

FIG. 15 is a schematic illustration of a cluster tool 1500 according to some embodiments of the present invention. The cluster tool 1500 includes a plurality of selectable fabrication tools 1502-1518. The fabrication tools 1502-1518 include a deposition system 1502. For example, the deposition system 1502 may include the features of the deposition system 100 schematically illustrated in FIG. 1. The deposition system 1502 may be configured to deposit deposition source material on a wafer at a first angle of deposition. The fabrication tools 1502-1518 also include a dielectric system 1504. The dielectric system 1504 includes a dielectric source 1522 configured to form a dielectric layer on the wafer. The dielectric source 1522 may be a source of a dielectric material for deposition, for example, using sputter deposition, molecular beam epitaxy, or chemical vapor deposition. Alternatively, the dielectric source 1522 may be an oxygen source, and the oxygen source may be used to oxidize the metal on the wafer, thereby forming an oxide layer.

According to some embodiments of the present invention, the cluster tool 1500 also includes a second deposition system 1506. The second deposition system 1506 may be configured to deposit source material on the wafer at a second angle of deposition. The second angle of deposition may be different from the first angle of deposition. For example, one of the first and second angles of deposition may be 90°, while the other of the first and second angles of deposition may be an angle less than 90°. The second deposition system 1506 may include an evaporation shield, as well as a collimated slit.

The deposition system 1502, dielectric system 1504, and second deposition system 1506 may be used to form a plurality of Dolan bridge Josephson junctions on the wafer. For example, the deposition system 1502 may form a plurality of first leads of a plurality of Dolan bridge Josephson junctions, like the first lead 506 in FIGS. 5A and 5B. Subsequently, the dielectric system 1504 may form a dielectric layer on the first leads, like the dielectric layer 600 in FIGS. 6A and 6B. Then the second deposition system 1506 may form a plurality of second leads of the plurality of Dolan bridge Josephson junctions, like the second lead 702 in FIGS. 7A and 7B. The combination of the proximity mask and the scanning stage in each of the deposition systems 1502, 1506 enables a plurality of uniform features to be formed on the surface of the wafer. The wafer can later be divided into individual chips. For example, the wafer may have a diameter of about 200 mm, and may be divided into 20 mm×20 mm chips.

The cluster tool 1500 may include additional fabrication tools for preparation of the wafer. For example, the cluster tool 1500 may include an anneal system 1508. The anneal system 1508 may include a heat source 1524 configured to anneal the wafer. The anneal system 1508 may be, for example, a rapid thermal anneal system, or a laser anneal system. The cluster tool 1500 may include a cleaning system configured to clean a deposition surface of the wafer. For example, the cluster tool 1500 may include a SICONI clean system 1510. The cluster tool 1500 may also include a sputter clean system, a reactive ion etch clean system, or a plasma clean system 1512. The cluster tool 1500 may also include a sputter metal deposition system or a sputter encapsulation system 1514.

The cluster tool 1500 may include an encapsulation system 1516 configured to dispose an encapsulation layer on the wafer. The encapsulation system 1516 may be, for example, an atomic layer deposition (ALD) or metal-organic chemical vapor deposition (MOCVD) encapsulation system, or a plasma encapsulation system. The deposition of the encapsulation material may be directional, and may include encapsulating the wafer with a film of silicon oxide or aluminum oxide, for example.

The cluster tool 1500 may include an additional reactive ion etch process and clean system 1518. The cluster tool 1500 may include an input/output 1520 configured to receive a wafer for processing, and output the wafer once processing is complete. The cluster tool 1500 may include an automated transport system configured to transport a wafer from one fabrication tool to another. For example, the cluster tool 1500 may receive the wafer at the input/output 1520, then process the wafer in the plurality of selectable fabrication tools 1502-1518. The wafer may be processed in each of the selectable fabrication tools 1502-1518, or in a subset of selectable fabrication tools 1502-1518. According to an embodiment of the present invention, the cluster tool 1500 receives the wafer at the input/output 1520, cleans the wafer using the SICONI clean system 1510, deposits a first Dolan bridge Josephson junction lead using the deposition system 1502, forms a dielectric layer using the dielectric system 1504, and deposits a second Dolan bridge Josephson junction lead using the second deposition system 1506. The cluster tool 1500 then anneals the wafer using the anneal system 1508, and outputs the wafer at the input/output 1520. This process is provided as a non-limiting example. The cluster tool 1500 may include additional, fewer, or alternative fabrication tools than those schematically illustrated in FIG. 15, and the position and order of the fabrication tools may be different than those illustrated in FIG. 15.

The cluster tool 1500 may be configured to processes multiple wafers simultaneously. For example, each selectable fabrication tool 1502-1518 may be configured to hold one or more wafers at a given time. The wafers may be passed from one fabrication tool to the next, such that a plurality of wafers are simultaneously at different stages in the production process. The cluster tool 1500 may enable production of the wafers without breaking vacuum.

The cluster tool 1500 enables process control and in situ metrology. The thickness of the metal layers can be controlled, as can the temperature of the deposition chamber and the wafer during deposition. For example, the deposition systems 1502, 1506 may include refrigeration systems that cool the wafer during the deposition in order to avoid lumps and bumps from forming in the deposited film due to atomic aggregation. The refrigeration systems may cool the wafer to −30° C. or less, for example.

The cluster tool 1500 also enables control of the thickness of the dielectric layer, and ensures uniformity of metal deposition across the slit in the proximity mask. The cluster tool 1500 provides chemical deposition uniformity capable of full wafer production, and enables optimization of each processing step. The cluster tool 1500 may use lithographic materials compatible with each of the plurality of selectable fabrication tools 1502-1518. Further, a liftoff mask such as the liftoff mask having a first layer 402 and a second layer 404 schematically illustrated in FIG. 4 may be formed on the wafer prior to inputting the wafer to the cluster tool 1500.

Figure 16:
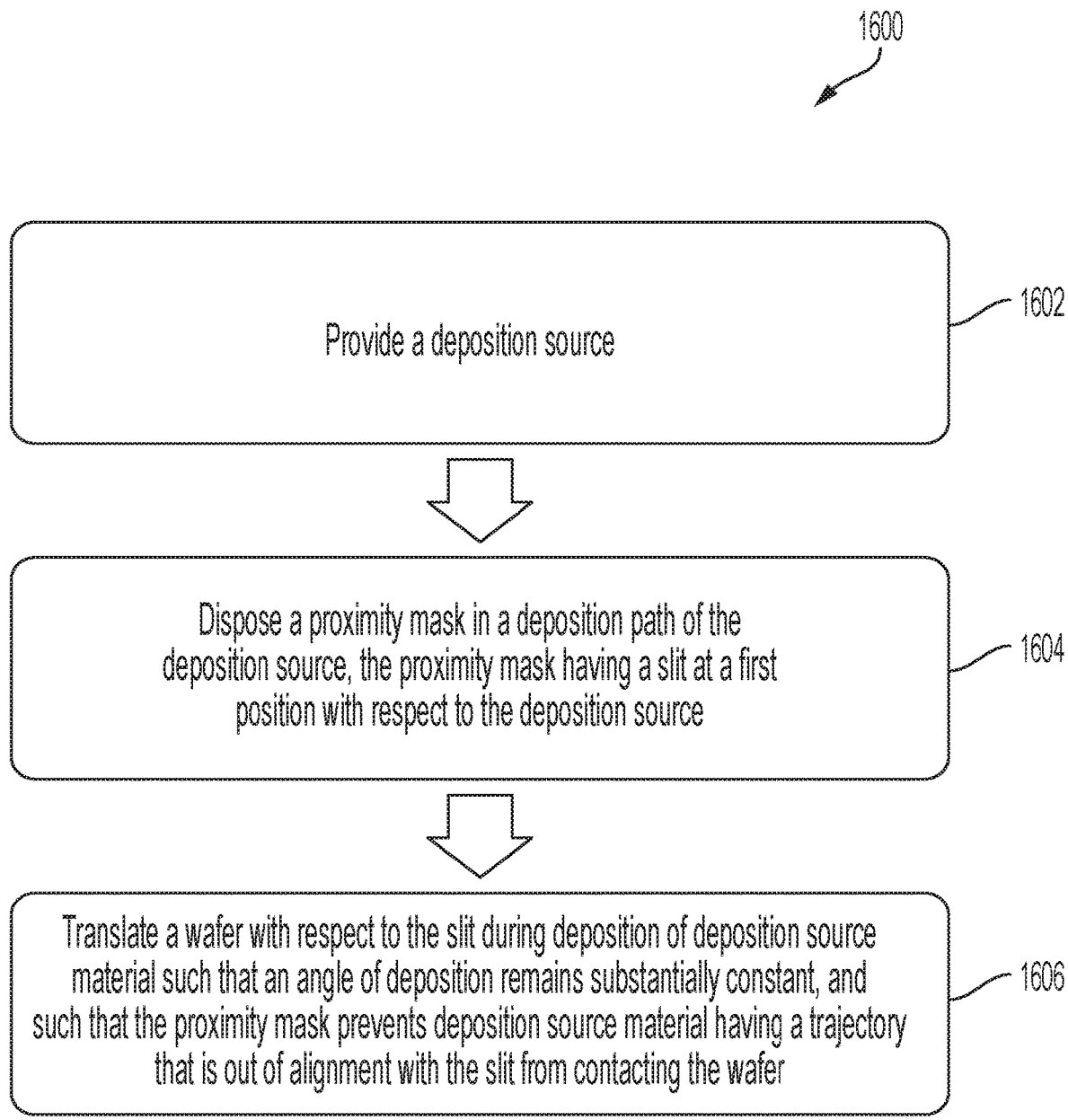
FIG. 16 is a schematic illustration of a method for performing angled deposition according to some embodiments of the present invention.

FIG. 16 is a schematic illustration of a method 1600 for performing angled deposition according to some embodiments of the present invention. The method 1600 includes providing a deposition source 1602. The method 1600 includes disposing a proximity mask in a deposition path of the deposition source, the proximity mask having a slit at a first position with respect to the deposition source 1604. The method 1600 includes translating a wafer with respect to the slit during deposition of deposition source material such that an angle of deposition remains substantially constant, and such that the proximity mask prevents deposition source material having a trajectory that is out of alignment with the slit from contacting the wafer 1606.

According to some embodiments, the method 1600 further includes forming a dielectric layer on the deposition source material deposited on the wafer. The method 1600 may further include changing a position of the slit with respect to the deposition source to a second position that is different from the first position, and translating the wafer with respect to the slit during a second deposition of deposition source material such that an angle of second deposition remains substantially constant, and such that the proximity mask prevents deposition source material having a trajectory that is not aligned with the slit from contacting the wafer.

According to some embodiments of the present invention, an evaporation unit includes a wafer stage capable of scanning, and a proximity mask at an angle to the source, during metal deposition. The evaporation unit may include an elongated source material container to enable uniform supply of material across an elongated collimation shield, to enable uniform wafer coating as the wafer is scanned past the elongated evaporation collimation opening. According to some embodiments of the present invention, a cluster tool enables full processing of device module structures in situ without breaking vacuum. The cluster tool includes tools for wafer clean, metal deposition, dielectric deposition, anneals, full wafer scanning angled metal evaporation with production worthy critical dimension control, and encapsulation.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A deposition system, comprising:
    a deposition source;
    a scanning stage disposed within a deposition path of the deposition source, the scanning stage comprising a support platform configured to support a wafer thereon, and a mechanical actuator coupled to the support platform, the mechanical actuator configured to translate the support platform with respect to the deposition source;
    a proximity mask disposed within the deposition path of the deposition source between the deposition source and the scanning stage, the proximity mask defining a slit, wherein the proximity mask is directly connected to a proximity mask fixture, which fixes the proximity mask in a defined position during operation of the deposition system, and wherein the support platform is mobile and movable left to right during the operation of the deposition system; and
    a controller in communication with the scanning stage, the controller configured to control the mechanical actuator to translate the wafer with respect to the slit such that an angle of deposition remains substantially constant, wherein the angle of deposition is selectable, wherein, in operation, the proximity mask prevents deposition source material having a trajectory that is out of alignment with the slit from contacting the wafer, and
    wherein a length of the slit is adjustable.

2. The deposition system according to claim 1, wherein the deposition source spans the length of the slit.

3. The deposition system according to claim 1, wherein the length of the slit is less than a length of the proximity mask.

4. The deposition system according to claim 1, wherein an angle of the support platform with respect to the deposition path is selectable.

5. The deposition system according to claim 1, wherein the mechanical actuator is configured to translate the support platform in a direction parallel to a deposition surface of the wafer.

6. The deposition system according to claim 1, wherein the mechanical actuator is configured to translate the support platform in a direction at an oblique angle with respect to a deposition surface of the wafer.

7. The deposition system according to claim 1, wherein the deposition source is a metal evaporation source.

8. The deposition system according to claim 1, further comprising a laser configured to irradiate the deposition source,
    wherein the deposition system is configured to deposit a deposition source material by pulsed laser deposition.

9. The deposition system according to claim 1, further comprising a gas inlet and a gas outlet configured to introduce gas into and remove gas from a chamber in which the deposition system is disposed,
    wherein the deposition system is configured to deposit a source material by sputter deposition.

10. The deposition system according to claim 1, further comprising a deposition chamber,
 wherein the deposition source, the scanning stage, and the proximity mask are disposed in the deposition chamber.

* * * * *